(12) United States Patent
Khan et al.

(10) Patent No.: US 7,618,849 B2
(45) Date of Patent: Nov. 17, 2009

(54) INTEGRATED CIRCUIT PACKAGE WITH ETCHED LEADFRAME FOR PACKAGE-ON-PACKAGE INTERCONNECTS

(75) Inventors: Rezaur Rahman Khan, Rancho Santa Margarita, CA (US); Ken Jian Ming Wang, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 11 days.

(21) Appl. No.: 11/876,467

(22) Filed: Oct. 22, 2007

(65) Prior Publication Data

US 2009/0102030 A1    Apr. 23, 2009

(51) Int. Cl.
*H01L 23/495* (2006.01)
(52) U.S. Cl. .................. 438/127; 257/675; 438/122
(58) Field of Classification Search ............. 257/666, 257/787; 174/535, 536, 537, 538; 361/820; 438/127
See application file for complete search history.

(56) References Cited

U.S. PATENT DOCUMENTS 6,114,770 A * 9/2000 Akram et al. ............. 257/784

* cited by examiner

*Primary Examiner*—Zandra Smith
*Assistant Examiner*—Lawrence Tynes, Jr.
(74) *Attorney, Agent, or Firm*—Fiala & Weaver P.L.L.C.

(57) ABSTRACT

Methods, systems, and apparatuses for integrated circuit packages, and for package stacking, are provided. An electrically conductive frame is attached to a first surface of a substrate. The electrically conductive frame includes a perimeter ring portion, a plurality of leads, and a plurality of interconnect members positioned within a periphery formed by the perimeter ring portion. Each interconnect member is coupled to the perimeter ring portion by a respective lead. A first end of each interconnect member is coupled to the first surface of the substrate. An encapsulating material is applied to the first surface of the substrate, without covering a second end of each interconnect member with the encapsulating material. The perimeter ring portion is removed from the electrically conductive frame to isolate the plurality of interconnect members. A first integrated circuit package is formed in this manner. A second integrated circuit package may be mounted to the first package. Signals of the first package may be electrically coupled with the second package at the exposed second ends of the interconnect members. Side surfaces of the interconnect members may be exposed at sides of the first package.

10 Claims, 12 Drawing Sheets

300

400

900

902 attach an electrically conductive frame to a first surface of a substrate

904 apply an encapsulating material to the first surface of the substrate to at least partially encapsulate the electrically conductive frame such that the second end of each interconnect member is not covered by the encapsulating material

906 remove a perimeter ring portion from the electrically conductive frame to isolate the plurality of interconnect members, and optionally expose a side surface of at least one interconnect member through the encapsulating material

FIG. 9

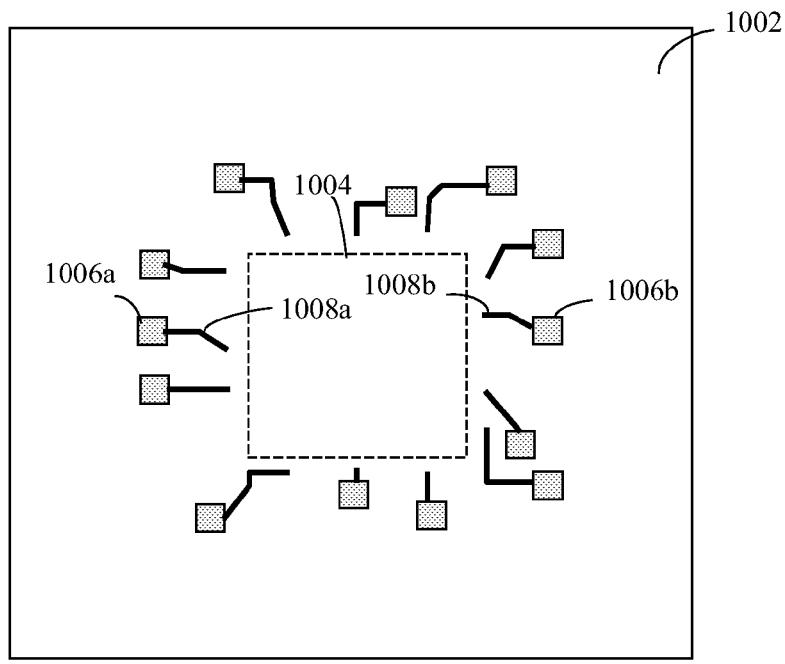

FIG. 10

INTEGRATED CIRCUIT PACKAGE WITH ETCHED LEADFRAME FOR PACKAGE-ON-PACKAGE INTERCONNECTS

BACKGROUND OF THE INVENTION

1. Field of the Invention

The present invention relates to integrated circuit packaging technology, and more particularly, to integrated circuit package interconnection technology.

2. Background Art

Integrated circuit (IC) chips or dies from semiconductor wafers are typically interfaced with other circuits using a package that can be attached to a printed circuit board (PCB). One such type of IC package is a ball grid array (BGA) package. BGA packages provide for smaller footprints than many other package solutions available today. A BGA package has an array of solder ball pads located on a bottom external surface of a package substrate. Solder balls are attached to the solder ball pads. The solder balls are reflowed to attach the package to the PCB.

Multiple integrated circuit packages may be stacked upon one another to provide additional functionality in a small footprint in a package-on-package (POP) manner. In one POP implementation, a die (or dice) of a first package is coupled through an encapsulating material of the first IC package to a second IC package using solder balls formed on a substrate of the first IC package that are subsequently encapsulated by the encapsulating material. None of the solder balls of the interconnect structure may be exposed through the encapsulating material at a side edge of the encapsulating material, or the material of the solder balls may flow out of the encapsulating material when the second IC package is being solder connected to the first IC package. Thus, the first IC package requires a peripheral edge region of encapsulating material to be present, which in turn causes an undesired increase in size of the first IC package.

Millions of integrated circuit packages are needed each year to be implemented in electronic devices. What are needed are improved packaging-on-packaging techniques that can help meet the high quantity production needs for integrated circuit packages, and can produce smaller footprint packages.

BRIEF SUMMARY OF THE INVENTION

Methods, systems, and apparatuses for an electrically conductive frame, for integrated circuit (IC) packages, and for IC package stacking are provided. An electrically conductive frame is attached to a first surface of a substrate. The electrically conductive frame includes a perimeter ring portion, a plurality of leads, and a plurality of interconnect members positioned within a periphery formed by the perimeter ring portion. Each interconnect member is coupled to the perimeter ring portion by a respective lead. A first end of each interconnect member is coupled to the first surface of the substrate when the frame is attached to the substrate.

An encapsulating material is applied to the first surface of the substrate. A second end of each interconnect member is not covered by the encapsulating material. The perimeter ring portion is removed from the electrically conductive frame (along with a portion of the substrate) to isolate the plurality of interconnect members. A first integrated circuit package is formed in this manner.

A second integrated circuit package may be mounted to the first package. For example, contact pads or solder balls of the second package may be aligned with corresponding second ends of the interconnect members. The contact pads/solder balls may be attached to the interconnect members by reflow soldering or other mechanism. Signals of the first package may be electrically coupled with signals of the second package through the interconnect members.

In a further aspect, side surfaces of the interconnect members may be exposed at sides of the first package. For instance, the side surfaces may be exposed when the perimeter ring portion is removed.

In a still further aspect, the electrically conductive frame may include a heat sink positioned within the perimeter ring portion. The heat sink is coupled to the perimeter ring portion by a respective lead. Attachment of the frame to the substrate may align the heat sink over a surface of a die attached to the first surface of the substrate. Removal of the perimeter ring portion of the frame isolates the heat sink, leaving the heat sink coupled to the surface of the die.

These and other objects, advantages and features will become readily apparent in view of the following detailed description of the invention. Note that the Summary and Abstract sections may set forth one or more, but not all exemplary embodiments of the present invention as contemplated by the inventor(s).

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

FIG. 9 shows a flowchart providing a process for assembling an integrated circuit (IC) package structure, according to embodiments of the present invention.

FIG. 10 shows a plan view of a substrate, according to an example embodiment of the present invention.

Figure 1:
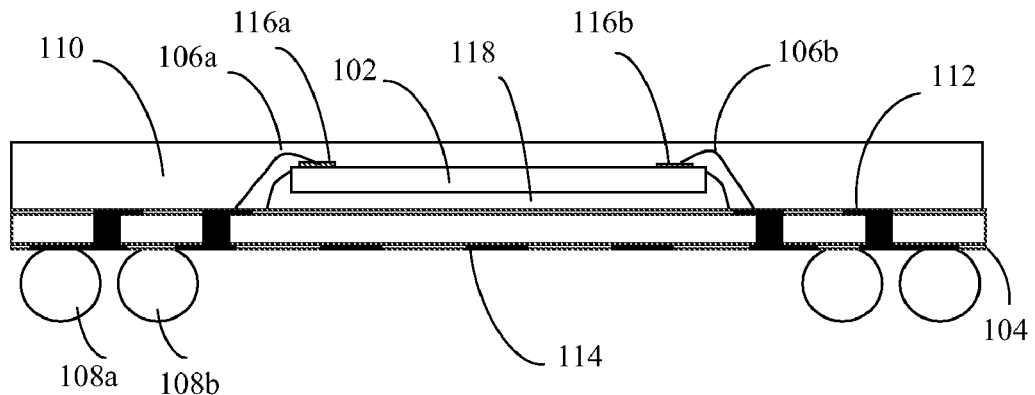
FIG. 1 shows a cross-sectional side view of an example BGA package.

The present invention will now be described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION OF THE INVENTION

Introduction

The present specification discloses one or more embodiments that incorporate the features of the invention. The disclosed embodiment(s) merely exemplify the invention. The scope of the invention is not limited to the disclosed embodiment(s). The invention is defined by the claims appended hereto.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described.

Furthermore, it should be understood that spatial descriptions (e.g., "above," "below," "up," "left," "right," "down," "top," "bottom," "vertical," "horizontal," etc.) used herein are for purposes of illustration only, and that practical implementations of the structures described herein can be spatially arranged in any orientation or manner.

Example Integrated Circuit Packages and Structures

Embodiments of the present invention are applicable to a variety of types of stacked integrated circuit packages, including ball grid array (BGA) packages and land grid array (LGA) packages. Example BGA and LGA packages are described in the following paragraphs. These examples are provided for illustrative purposes, and are not intended to be limiting. Embodiments of the present invention are applicable to a variety of types of integrated circuit packages, including land grid array (LGA) packages, BGA packages, and further package types, as would be known to persons skilled in the relevant art(s).

FIG. 1 shows a cross-sectional view of an example BGA package 100. BGA package 100 may be a plastic BGA (PBGA) package, a flex BGA package, a ceramic BGA package, a fine pitch BGA (FPBGA or FBGA) package, or other type of BGA package. BGA package 100 includes an integrated circuit die/chip 102, a substrate 104, bond wires (also known as "wire bonds") 106, a plurality of solder balls 108, and an encapsulating material 110. Substrate 104 has a first (e.g., top) surface 112 that is opposed to a second (e.g., bottom) surface 114 of substrate 104. As shown in FIG. 1, die 102 is mounted to first surface 112 of substrate 104. Die 102 may be mounted to substrate 104 using an adhesive material 118.

As shown in FIG. 1, a plurality of bond wires 106 are coupled between terminals 116 of die 102 and electrically conductive features, such as traces, bond fingers, etc. (not shown in FIG. 1), at first surface 112 of substrate 104. For example, a first bond wire 106a is connected between a terminal 116a and first surface 112 of substrate 104, and a second bond wire 106b is connected between a terminal 116b and first surface 112 of substrate 104. Any number of bond wires 106 may be present, depending on a number of signals (at terminals 116) of die 102 to be coupled to conductive features of first surface 112 of substrate 104. Bond wires 106 may be wires formed of any suitable electrically conductive material, including a metal such as gold, silver, copper, aluminum, other metal, or combination of metals/alloy. Bond wires 106 may be attached according to wire bonding techniques and mechanisms well known to persons skilled in the relevant art(s).

As further shown in FIG. 1, encapsulating material 110 covers die 102 and bond wires 106 on first surface 112 of substrate 104. Encapsulating material 110 protects die 102 and bond wires 106 from environmental hazards. Encapsulating material 110 may be any suitable type of encapsulating material, including an epoxy, a mold compound, etc. Encapsulating material 110 may be applied in a variety of ways, including by a saw singulation technique, injection into a mold, etc.

Figure 2:
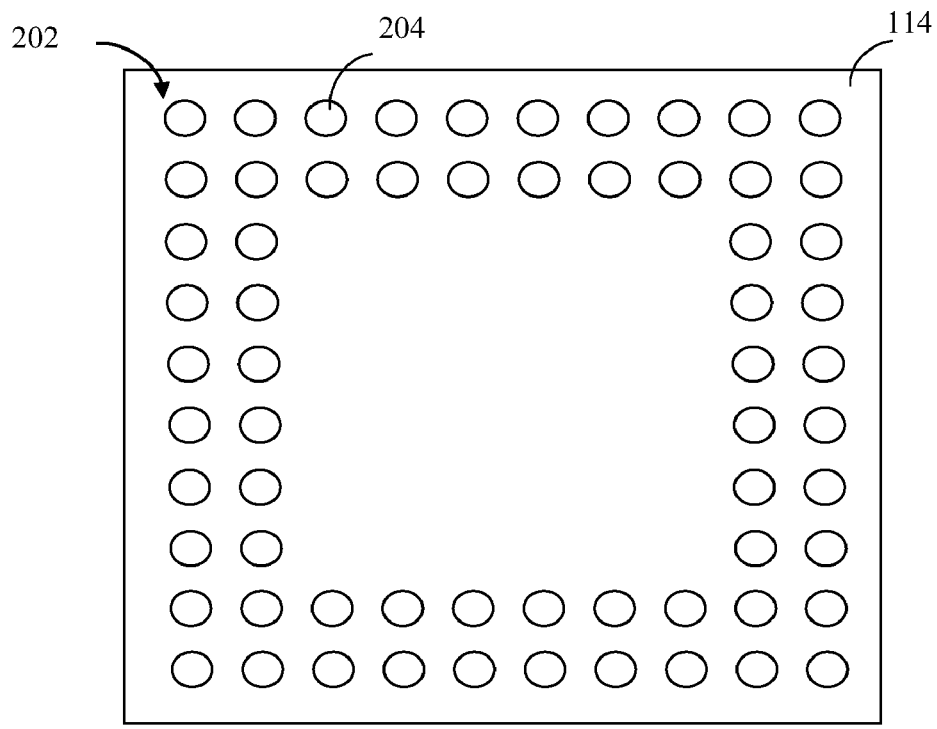
FIG. 2 shows a bottom view of the BGA package of FIG. 1.

A plurality of solder balls 108 (including solder balls 108a and 108b indicated in FIG. 1) is attached to second surface 114 of substrate 104. FIG. 2 shows a bottom view of package 100, showing second surface 114 of substrate 104. Solder balls 108 are not shown in FIG. 2. Instead, in FIG. 2, second surface 114 of substrate 104 includes an array 202 of contact pads 204, which may also be referred to as solder ball pads in a BGA package embodiment. In the example of FIG. 2, array 202 includes pads 204 arranged in two concentric rectangular rings. In other implementations, array 202 may include fewer or greater numbers of pads 204 arranged in any number of rings, rows, and/or columns, including a full array of pads 204. Pads 204 are attachment locations for solder balls 108 (shown in FIG. 1) on package 100 in a BGA package embodiment. Pads 204 are electrically coupled through substrate 104 (e.g., by electrically conductive vias and/or routing) to the electrically conductive features (e.g., traces, bond fingers, contact regions, etc.) of first surface 112 of substrate 104 to enable signals of die 102 to be electrically connected to solder balls 108.

Substrate 104 may include one or more electrically conductive layers (such as at first surface 112) that are separated by one or more electrically insulating layers. An electrically conductive layers may include traces/routing, bond fingers, contact pads, and/or other electrically conductive features. For example, BGA substrates having one electrically conductive layer, two electrically conductive layers, or four electrically conductive layers are common. The electrically conductive layers may be made from an electrically conductive material, such as a metal or combination of metals/alloy, including copper, aluminum, tin, nickel, gold, silver, etc. In embodiments, substrate 104 may be rigid or may be flexible (e.g., a "flex" substrate). The electrically insulating layer(s) may be made from ceramic, plastic, tape, and/or other suitable materials. For example, the electrically insulating layer (s) of substrate 104 may be made from an organic material such as BT (bismaleimide triazine) laminate/resin, a flexible tape material such as polyimide, a flame retardant fiberglass composite substrate board material (e.g., FR-4), etc. In an embodiment, first surface 112 of substrate 104 may have a centrally located cavity (not shown in FIG. 1) in which die 118 may be mounted, to lower die 118 and thus lower an overall height of package 100.

Other configurations for BGA package 100 are within the scope of embodiments of the present invention. For example, package 100 may include heat spreaders and/or heat sinks configured to spread heat within and/or outside package 100. Furthermore, LGA packages similar to BGA package are within the scope of embodiments of the present invention. For example, an LGA package may be similar to BGA package 100 shown in FIG. 1, except that solder balls 108 are not present.

Figure 3:
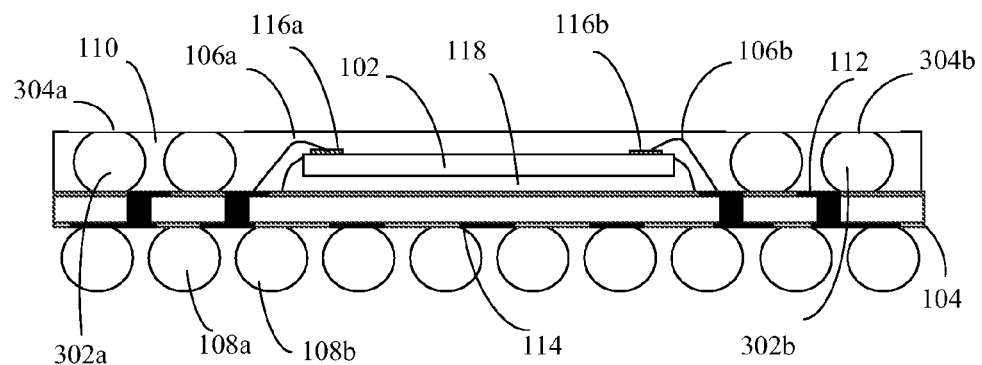
FIG. 3 shows a cross-sectional side view of an integrated circuit package configured to be the base package in a conventional package-on-package stack.

Package 100 may be modified to enable a second integrated circuit package to be stacked on package 100. For example, FIG. 3 shows a cross-sectional side view of an integrated circuit package 300 that is generally similar to BGA package 100 of FIG. 1, with the addition of a plurality of solder balls 302 attached to first surface 112 of substrate 104. Example solder balls 302a and 302b are indicated in FIG. 3. Each solder ball 302 is formed to have a respective top surface 304 (e.g., top surface 304a for solder ball 302a and top surface 304b for solder ball 302b) that is exposed through (not covered by) encapsulating material 110. For example, solder balls 302 may be deposited on first surface 112 prior to applying encapsulating material 110 to package 300. Encapsulating material 110 is applied to package 300, entirely covering solder balls 302. A top surface of package 300 is removed, removing a portion of encapsulating material 110 and solder balls 302, leaving planar top surfaces 304 exposed on the top surface of package 300.

Figure 4:
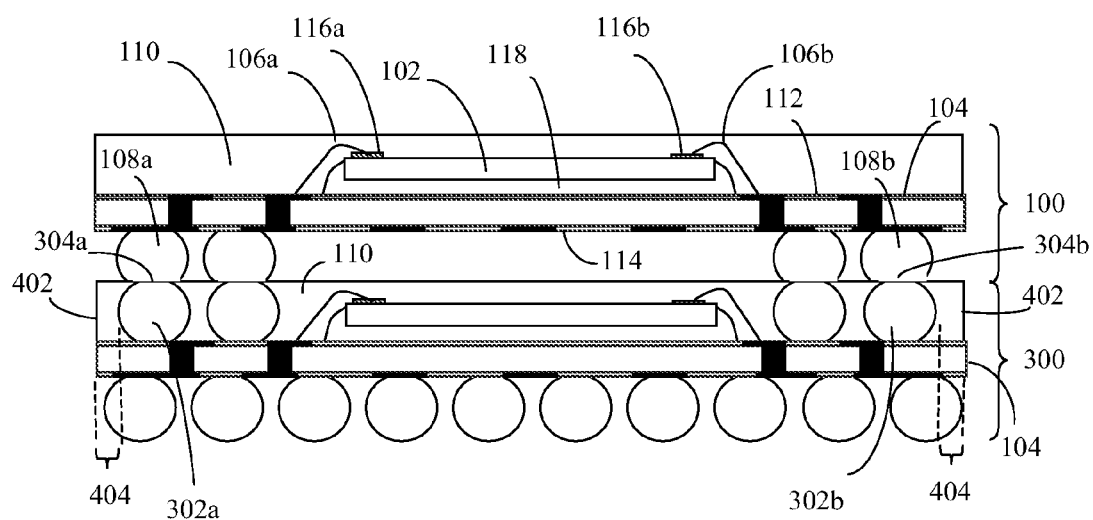
FIG. 4 shows a cross-sectional side view of a package-on-package (POP) structure that includes the package of FIG. 1 stacked on package the package of FIG. 3.

The plurality of solder balls 302 form interconnects for attaching a second package to package 300. For example, FIG. 4 shows a cross-sectional side view of a package-on-package (POP) structure 400 that includes package 100 of FIG. 1 stacked on package 300. As shown in FIG. 4, solder balls 108 on second surface 114 of package 100 are coupled to solder balls 302 of package 300. For instance, solder ball 108a of package 100 is coupled to solder ball 302a of package 300, and solder ball 108b of package 100 is coupled to solder ball 302b of package 300.

As shown in FIGS. 3 and 4, solder balls 302 of package 300 are positioned on first surface 112 of substrate 104 of package 300 in contact with corresponding electrical features on first surface 112 of substrate 104 of package 300. The electrical features may be coupled to electrical signals of die 102 of package 300 through wire bonds, solder balls (e.g., in a flip chip configuration), and/or other electrical connection mechanism. Solder balls 302 of package 300 and solder balls 108 of package 100 provide an electrical connection for the electrical signals of die 102 of package 300 to be provided to package 100.

To form POP structure 400, package 100 may be positioned on top of package 300, such that surface 304 of each solder ball 302 of package 300 is in contact with a respective solder ball 108 of package 100. Solder balls 108 and 302 may then be reflowed to cause respective solder ball 108/302 pairs to attach to each other. Because solder balls 302 partially or entirely melt during the reflow process, the sides of solder balls 302 cannot be exposed at side surfaces 402 of encapsulating material 110 of package 300, or solder balls 302 would partially or entirely flow from package 300. If the material of a solder ball 302 (e.g., solder ball 302a) flows from package 300 through a side 402 of package 300, an electrical connection from package 300 to package 100 through the respective solder ball 108/302 pair (e.g., solder ball 108a/302a pair) may not form, causing POP structure 400 to not operate properly.

Thus, to ensure that solder balls 302 do not flow out sides 402 of package 300 during reflow, solder balls 302 must be positioned on substrate 104 in encapsulating material 110 of package 300 spaced from sides 402 by a thickness 404. For example, thickness 404 may be 100 mils, or other distance. Thickness 404 typically must be present around the perimeter of package 300 so that solder balls 302 are protected all the way around package 300. The portion of package 300 contained in the perimeter of thickness 404 is essentially wasted space, causing an undesired increase in size of package 300.

Embodiments of the present invention overcome the problem of excess package size suffered by the conventional POP structures described above, without substantially increasing structure complexity. Example embodiments are further described in the following section.

EXAMPLE EMBODIMENTS

Embodiments of the present invention incorporate a plurality of interconnect members from an electrically conductive frame into a first integrated circuit package. The electrically conductive frame is assembled into the first integrated circuit package, and a perimeter ring portion of the frame is removed, leaving the interconnect members isolated in the package to provide electrical connections between the first integrated circuit package and a second integrated circuit package. The example embodiments described herein are provided for illustrative purposes, and are not limiting. Additional structural and operational embodiments, including modifications/alterations, will become apparent to persons skilled in the relevant art(s) from the teachings herein.

Figure 5:
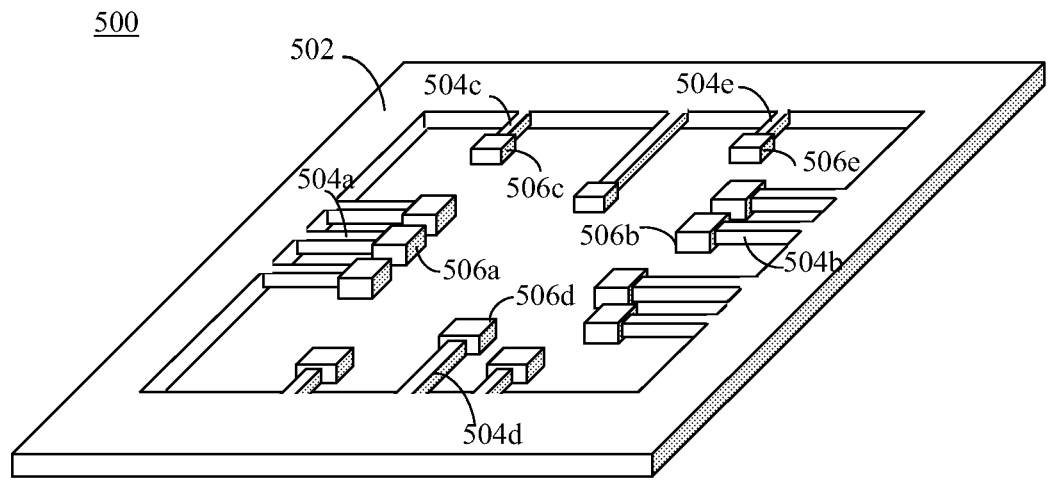
FIG. 5 shows a perspective view of an example electrically conductive frame, according to an example embodiment of the present invention.

FIG. 5 shows a perspective view of an example electrically conductive frame 500, according to an example embodiment of the present invention. Electrically conductive frame 500 may also be referred to as a "leadframe." As shown in FIG. 5, frame 500 includes a perimeter ring portion 502, a plurality of leads 504, and a plurality of interconnect members 506. As described below, frame 500 may be assembled into an integrated circuit (IC) package, to provide interconnect members 506 for forming electrical connections.

In the embodiment of FIG. 5, frame 500 is generally planar, although this is not required in all embodiments. Perimeter ring portion 502 forms a perimeter portion of frame 500. In the example of FIG. 5, perimeter ring portion 502 is a rectangular-shaped (e.g., square) frame, but in further embodiments may have an alternative shape, including elliptical, round, triangular, or other polygon. Perimeter ring portion 502 may be a continuous ring, as in FIG. 5, or may be separated at one or more locations.

Interconnect members 506 are positioned within a periphery formed by perimeter ring portion 502. Any number of interconnect members 506 may be present in embodiments. Although thirteen interconnect members 506 are shown in FIG. 5, for ease of illustration, only interconnect members 506a-506e are indicated with reference numerals in FIG. 5. Furthermore, any spacing/arrangement of interconnect members 506 may be present. An interconnect member 506 may have any shape, including being a square cube (as shown in FIG. 5), a rectangular cube, a trapezoid, a cylinder, a sphere, a pentagram, or any other shape. Each interconnect member 506 is coupled to perimeter ring portion 502 by a respective lead 504. For example, as shown in FIG. 5, a lead 504a connects interconnect member 506a to an inner edge of perimeter ring portion 502, and a lead 504b connects interconnect member 506b to the inner edge of perimeter ring portion 502.

Frame 500 may be made of any electrically conductive material, such as a metal including copper, aluminum, iron, steel, nickel, tin, gold, silver, other metal, or combination of metals/alloy. Frame 500 may be uniformly made from the electrically conductive material, or perimeter ring portion 502, leads 504, and interconnect members 506 may be made of different materials. In such an embodiment, interconnect members 506 are made of an electrically conductive material, while perimeter ring portion 502 and leads 504 do not necessarily need to be electrically conductive. Frame 500 may be manufactured in any manner, including by machining, etching, molding, lithography, and/or any other technique.

Figure 6:
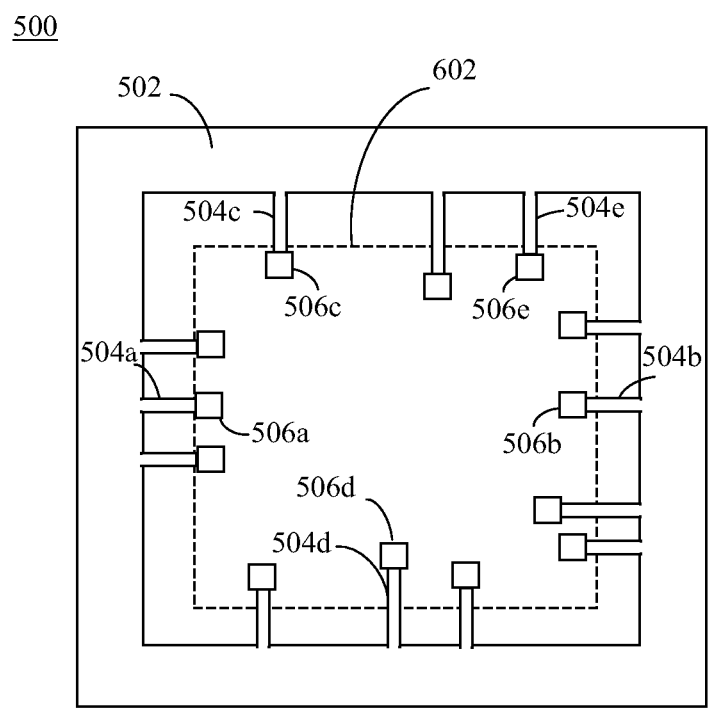
FIG. 6 shows a plan view of the frame of FIG. 5, according to an example embodiment of the present invention.

FIG. 6 shows a plan view of frame 500. As described above, frame 500 may be positioned in an integrated circuit package during assembly of the package. A first portion of frame 500 outside of a package outline 602 shown in FIG. 6 is removed from the package at some point during the package assembly process, while a second portion of frame 500 within package outline 602 will remain in the package. Perimeter ring portion 502 is removed, and a portion or all of one or more leads 504 may be removed, when the first portion of frame 500 outside of the package is removed. In this manner, interconnect members 506 are mechanically and/or electrically separated/isolated from each other, and interconnect members 506 remain in the package to provide electrical interconnections from the package.

Figure 7:
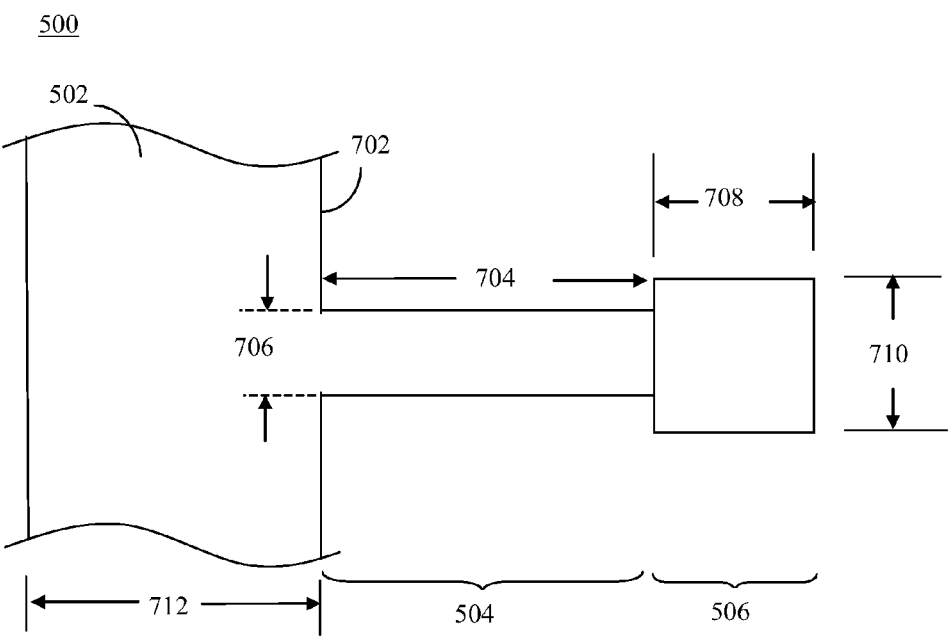
FIGS. 7 and 8 show plan and cross-sectional views, respectively, of a portion of the frame of FIG. 5, according to an example embodiment of the present invention.
Figure 8:
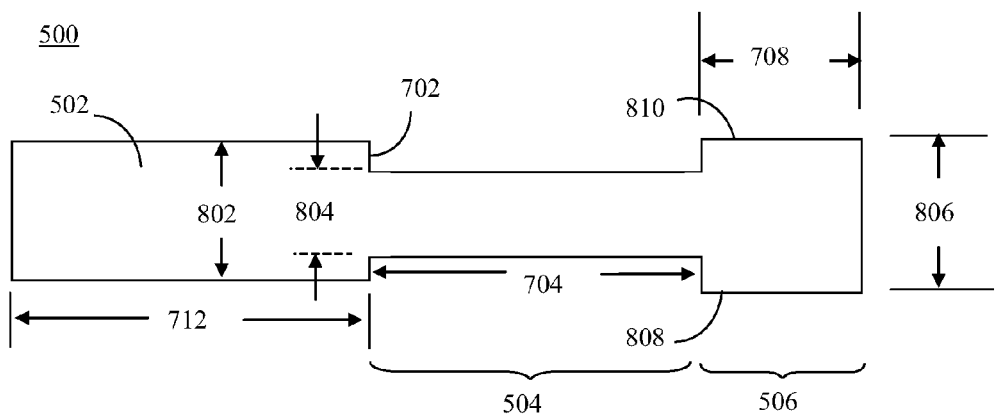

FIGS. 7 and 8 show plan and cross-sectional views, respectively, of a portion of frame 500, highlighting an interconnect member 506 and associated lead 504, according to an example embodiment of the present invention. As shown in FIGS. 7 and 8, lead 504 connects interconnect member 506 to an inner surface 702 of perimeter ring portion 502. As shown in FIG. 8, interconnect member 506 has opposing first and second ends 808 and 810. First end 808 of interconnect member 506 is configured to be coupled to a substrate of the package in which frame 500 is inserted. Second end 810 of interconnect member 506 is configured to be exposed at the top surface of the package in which frame 500 is inserted, to provide a location for interconnection with an entity external to the package, such as a second package in a POP structure.

As shown in the embodiment of FIGS. 7 and 8, an edge of perimeter ring portion 502 has a width 712 and a height 802. Lead 504 has a length 704, a width 706, and a height 804. Interconnect member 506 has a length 708, a width 710, and a height 806. These dimensions of perimeter ring portion 502, lead 504, and interconnect member 506 may have any values and relative proportions, as desirable for a particular implementation. Length 704 of lead 504 is typically greater than width 706 and height 806 of lead 504, but alternatively may be equal to, or may be less than width 706 and/or height 806 of lead 504. As shown in FIG. 7, width 706 of lead 504 is less than width 710 of interconnect member 506. Alternatively, width 706 of lead 504 may be greater than or equal to width 710 of interconnect member 506.

As shown in FIG. 8, height 804 of lead 504 may be less than height 802 of perimeter ring portion 502. For example, as shown in FIG. 8, lead 504 can be coupled to surface 702 so that a bottom edge of lead 504 is not even with a bottom edge of perimeter ring portion 502. In this configuration, when frame 500 is mounted to a surface (e.g., a package substrate, such as substrate 104 in FIG. 1), a gap is present between lead 504 and the surface. In this manner, lead 504 is not in contact with the surface, and thus will not cause a short with any electrical features of the surface. Similarly, lead 504 can be formed so that a top edge of lead 504 is not even with a top edge of perimeter ring portion 502 so that lead 504 can be covered with an encapsulating material to avoid shorts, etc. Alternatively, height 804 of lead 504 may be greater than or equal to height 802 of perimeter ring portion 502.

Height 804 of lead 504 may be less than height 806 of interconnect member 506. Lead 504 can be connected to interconnect member 506 such that a bottom edge of lead 504 is not even with a bottom edge of interconnect member 506. Again, this configuration will prevent lead 504 from contacting a surface to which frame 500 is mounted, to avoid lead 504 from causing a short with electrical features of the surface. Alternatively, height 804 of lead 504 may be greater than or equal to height 806 of interconnect member 506.

Frame 500 can be assembled into an integrated circuit package in any manner, to insert interconnect members 506 in the package for making electrical interconnections. For example, FIG. 9 shows a flowchart 900 providing a process for assembling an integrated circuit (IC) package structure, according to embodiments of the present invention. For instance, frame 500 of FIG. 5 may be used during the assembly process of flowchart 900. Other structural and operational embodiments will be apparent to persons skilled in the relevant art(s) based on the discussion regarding flowchart 900. Flowchart 900 is described as follows.

Flowchart 900 begins with step 902. In step 902, an electrically conductive frame is attached to a first surface of a substrate. For example, frame 500 of FIG. 5 may be attached to a substrate, such as the substrate shown in FIG. 10. FIG. 10 shows a plan view of a substrate 1000, according to an example embodiment of the present invention. Substrate 1000 may be any type of substrate, including being similar to substrate 104 described above with respect to FIG. 1, with differences described below. A first surface 1002 of substrate 1000 is shown in FIG. 10. As shown in FIG. 10, first surface 1002 includes a die mount region 1004, indicated by dotted lines. An integrated circuit die, such as die 102 described above with respect to FIG. 1, may be mounted in region 1004 prior to or after attachment of frame 500 to first surface 1002 according to step 902.

First surface 1002 of substrate 1000 further includes a plurality of contact pads 1006 and a plurality of associated traces 1008. For example, a first contact pad 1006a is coupled to a first trace 1008a, and a second contact pad 1006b is coupled to a second trace 1008b. Contact pads 1006 and traces 1008 are electrically conductive, and may be made of any suitable electrically conductive material, including copper, aluminum, nickel, tin, gold, silver, other metal, or combination of metals/alloy. Contact pads 1006 and traces 1008 may be manufactured in any suitable manner, including being etched in a metal foil, by lithography, and/or any other suitable process. Contact pads 1006 and traces 1008 may be a portion of an electrically conductive layer of substrate 1000.

Figure 11:
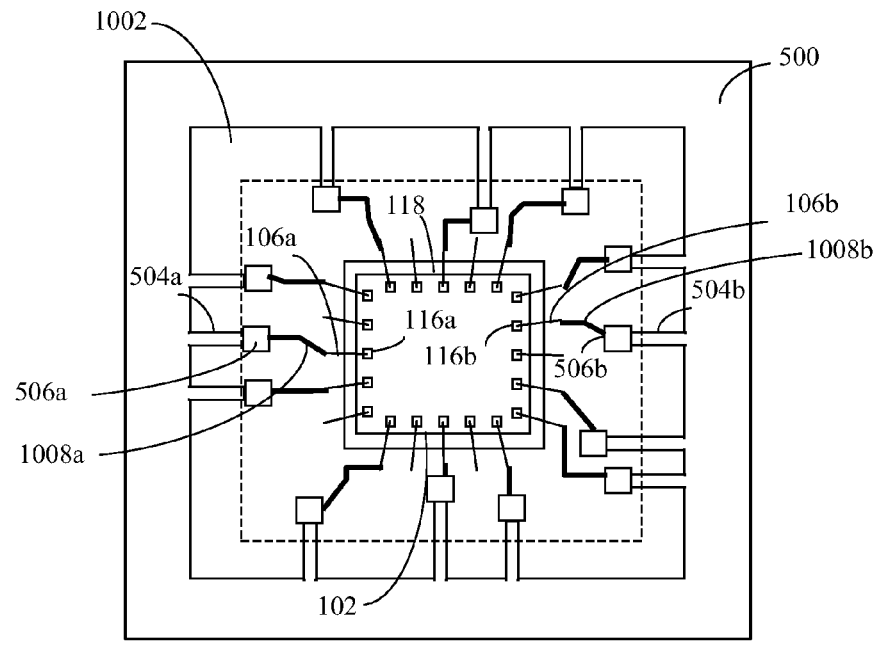
FIGS. 11 and 12 show plan and side cross-sectional views of a die and frame attached to a substrate, according to an embodiment of the present invention.
Figure 12:
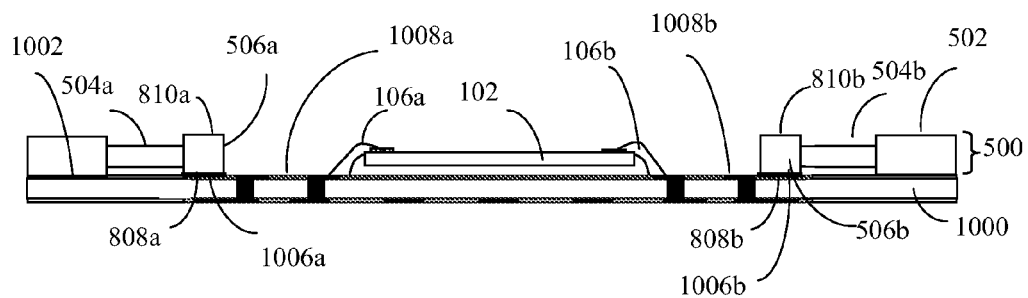

When a die is mounted in region 1004 in a wire bond, flip chip, or other configuration, electrical signals of the die are coupled to traces 1008, and therefore are coupled to the associated interconnect members 506. For example, FIGS. 11 and 12 show plan and side cross-sectional views of die 102 and frame 500 attached to first surface 1002 of substrate 1000, according to an embodiment of the present invention. Die 102 is mounted in region 1004 shown in FIG. 10 in an orientation for wire bonding, but may be alternatively mounted in a flip chip fashion. In step 902, frame 500 may be attached to first surface 1002, such that each interconnect member 506 (e.g., first end 808 shown in FIG. 8) of frame 500 is in electrical contact (e.g., in direct contact, contact through solder and/or other metal, etc.) with a corresponding contact pad 1006 on first surface 1002. In FIG. 11, when frame 500 of FIG. 5 is attached to substrate 1000 of FIG. 10, interconnect member 506a is coupled to contact pad 1006a, and interconnect member 506b is coupled to contact pad 1006b. A terminal 116a of die 102 is coupled to trace 1008a by a bond wire 106a, and a terminal 116b of die 102 is coupled to trace 1008b by a bond wire 106b. These connections provide electrical connections from die 102 to each of interconnect members 506a and 506b of frame 500. Further interconnect members 506 of frame 500 may be electrically connected to die 102 in a similar fashion.

Note that application of die 102 to substrate 1000 and application of bond wires 106 may occur prior to, or after attachment of frame 500 to substrate 1000.

Figure 13:
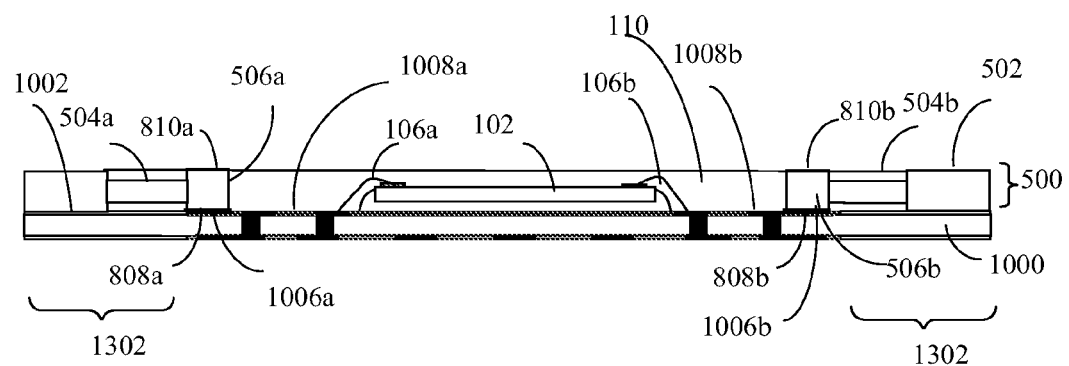
FIGS. 13 and 14 show a side cross-sectional view and a plan view, respectively, of a frame/substrate combination, and an encapsulating material that encapsulates a portion of the frame, according to an example embodiment of the present invention.
Figure 14:
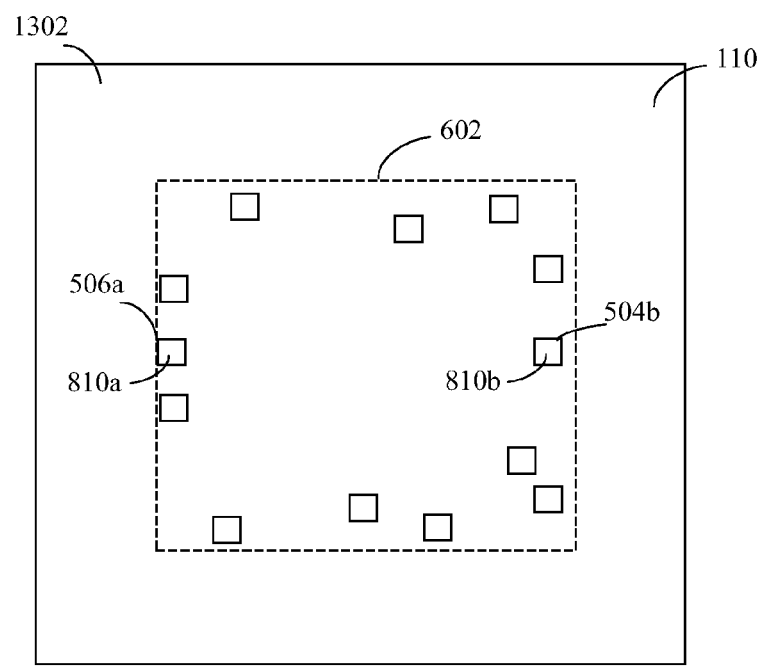

Referring back to flowchart 900, in step 904, an encapsulating material is applied to the first surface of the substrate to at least partially encapsulate the electrically conductive frame such that the second end of each interconnect member is not covered by the encapsulating material. For example, FIGS. 13 and 14 show a side cross-sectional view and a plan view, respectively, of the frame/substrate combination shown in FIGS. 11 and 12, and further shows encapsulating material 110 encapsulating die 102 and a portion of frame 500, according to an example embodiment of the present invention. As shown in FIG. 13, encapsulating material 110 fills an opening within perimeter ring portion 502, substantially covering leads 504 and interconnect members 506. However, second end 810 of each interconnect member 506 is not covered by encapsulating material 110. FIG. 14 shows a top surface view, where second ends 810 of interconnect members 506 are exposed (not covered) through encapsulating material 110.

Encapsulating material 110 may be applied in any manner. For example, in an embodiment, substrate 1000 and attached frame 500 may be placed in a mold chase that applies a surface to the top surface of frame 500. Encapsulating material 110 can be injected into the mold to fill the opening of frame 500 while not covering ends 810 due to the mold chase surface. Encapsulating material 110 can be cured, and substrate 1000, with frame 500 and the cured encapsulating material 110, can be removed from the mold.

In step 906, a perimeter ring portion is removed from the electrically conductive frame to isolate the plurality of interconnect members, and optionally expose a side surface of at least one interconnect member through the encapsulating material. Perimeter ring portion 502, and optionally a portion or all of leads 504, are removed in step 906, as well as an outermost portion of substrate 1000 to which perimeter ring portion 502 is attached, to form a substantially complete integrated circuit package. For instance, referring to FIG. 14, a portion of substrate 1000 and frame 500 outside of package outline 602 can be removed. Referring to FIG. 13, a perimeter portion 1302 that includes perimeter ring portion 502 can be removed.

Figure 15:
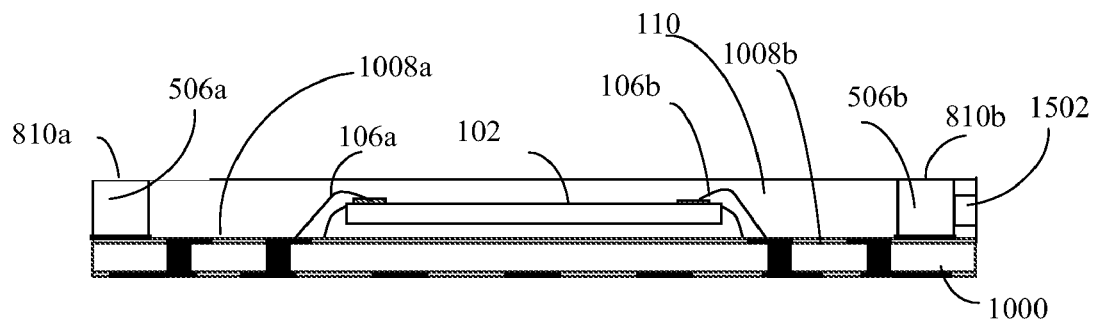
FIGS. 15 and 16 show a side cross-sectional view and a plan view, respectively, of an IC package formed by removing a perimeter ring portion of a frame, according to an example embodiment of the present invention.
Figure 16:
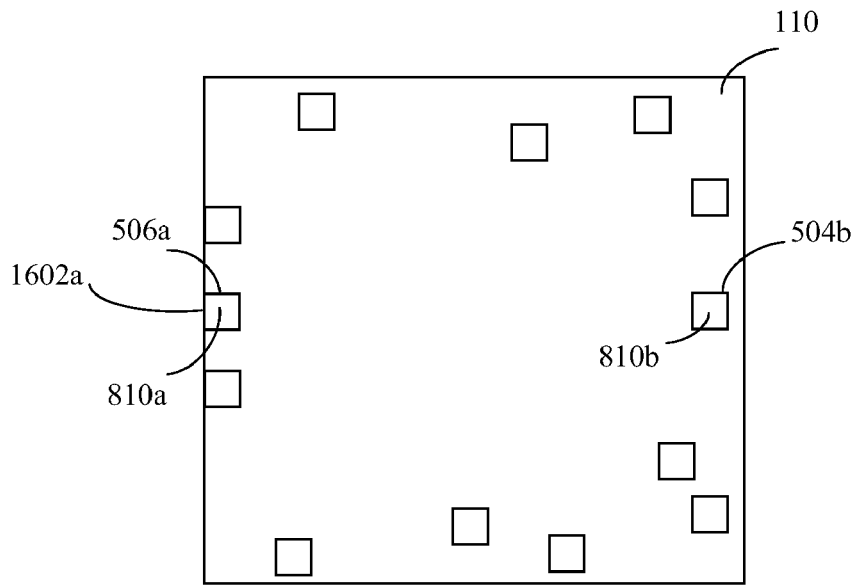

FIGS. 15 and 16 show a side cross-sectional view and a plan view, respectively, of a package 1500 formed by removing perimeter ring portion 502 from the substrate/frame combination shown in FIGS. 13 and 14, according to an example embodiment of the present invention. As shown in FIG. 15, perimeter ring portion 502 is removed, as well as a portion of substrate 1000 to which perimeter ring portion 502 was attached. Furthermore, lead 504a is removed, and a portion of lead 504b is removed, leaving a lead stub 1502. By removing perimeter ring portion 502, interconnect members 506 are separated/isolated from each other so that they each can conduct an isolated electrical signal, if desired.

Package 1500 can be created from the substrate/frame combination shown in FIGS. 13 and 14 by separating portion 1302 from the remainder of the substrate/frame combination, such as by sawing, milling, cutting, or by other separation technique. As shown in FIG. 16, package 1500 is formed by this separation such that a portion of interconnect members 506 (e.g., interconnect member 506a) have a side surface 1602 (e.g., side surface 1602a of interconnect member 506a) that is exposed through encapsulating material 110, while another portion of interconnect members 506 (e.g., interconnect member 506b) have all side surfaces covered with encapsulating material 110. In another embodiment, all of interconnect members 506 have at least one exposed side surface 1602, while in still another embodiment, none of interconnect members 506 have exposed side surfaces.

Figure 17:
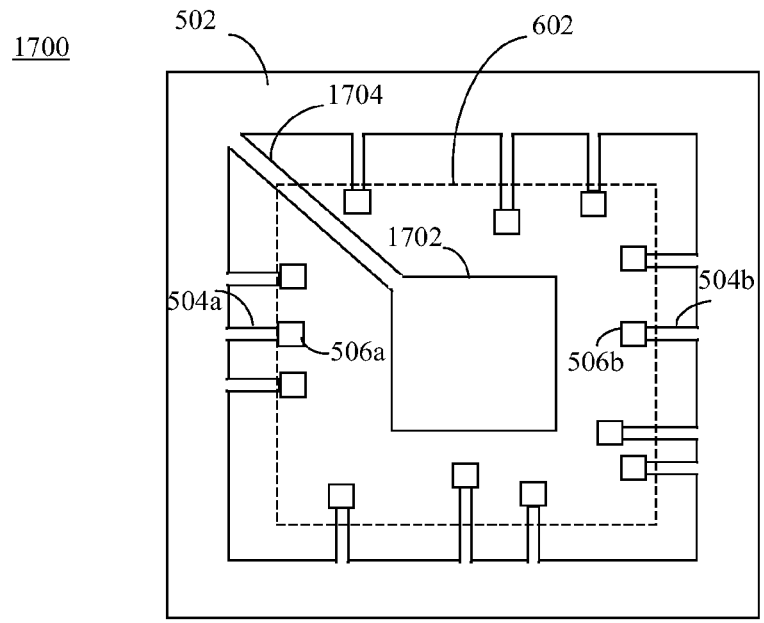
FIG. 17 shows an electrically conductive frame, according an example embodiment of the present invention.

Note that in a further embodiment, frame 500 may include additional electrically conductive and/or non-electrically conductive features. For example, FIG. 17 shows an electrically conductive frame 1700, according an embodiment of the present invention. Frame 1700 is generally similar to frame 500 shown in FIG. 5 and described above, with the addition of a heat sink 1702 and a lead 1704. As shown in FIG. 17, heat sink 1702 is rectangular shaped, and is centrally located within the opening through perimeter ring portion 502. Alternatively, heat sink 1702 can have other shapes and/or other position within the opening through perimeter ring portion 502. Heat sink 1702 is coupled to perimeter ring portion 502 by lead 1704. Lead 1704 connects a corner of heat sink 1702 to a corner of the inner surface of perimeter ring portion 502. In an alternative embodiment, lead 1704 may be connected to a non-corner portion of heat sink 1702 and/or may be connected to a non-corner portion of the inner surface of perimeter ring portion 502.

Figure 18:
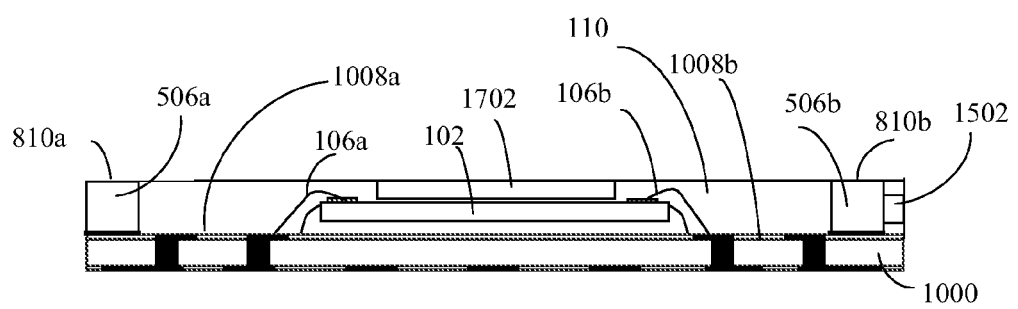
FIGS. 18 and 19 show a side cross-sectional view and a plan view, respectively, of an integrated circuit package formed using the frame of FIG. 17, according to an embodiment of the present invention.
Figure 19:
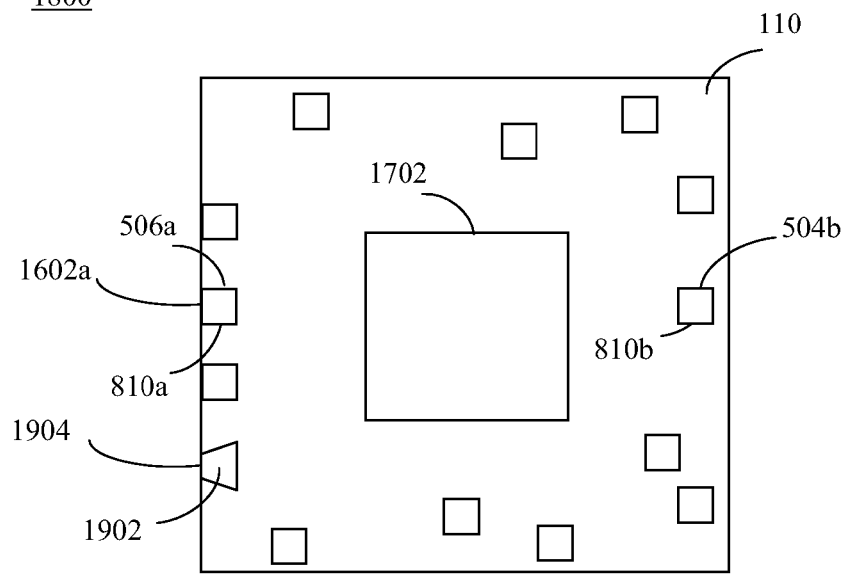

Similarly to frame 500, frame 1700 may be attached to first surface 1002 of substrate 1000 in step 902 of flowchart 900. Frame 1700 is attached to substrate 1000 after attachment of die 102 to first surface 1002 of substrate 1000. Heat sink 1702 is configured to be positioned on a top surface of die 102 when frame 1700 is attached to substrate 1000. An adhesive material may optionally be applied to die 102 and/or heat sink 1702 to adhere heat sink 1702 to the top surface of die 102. When perimeter ring portion 502 of frame 1700 is removed in step 906 of flowchart 900, heat sink 1702 remains positioned on die 102, and is mechanically and/or electrically isolated from interconnect members 506. For example, FIGS. 18 and 19 show a side cross-sectional view and a plan view, respectively, of an integrated circuit package 1800 that may be formed (e.g., according to flowchart 900) using frame 1700 of FIG. 17, according to an embodiment of the present invention.

Heat sink 1702 may be used to conduct heat from die 102 during operation of die 102. For example, heat sink 1702 may conduct the heat to the ambient air, to another heat sink attached to heat sink 1702, or to another structure coupled to heat sink 1702.

As mentioned above, interconnect members 506 may be rectangular, or may have other shapes. For example, FIG. 19 shows an interconnect member 1902 having a trapezoidal shape. As shown in FIG. 19, the short edge of the pair of parallel edges of interconnect member 1902 having different lengths is positioned to be the outermost edge of interconnect member 1902. A surface 1904 of the short edge is exposed at the edge of package 1800. By positioning the short edge as the outermost edge of interconnect member 1902, interconnect member 1902 is better mechanically held in encapsulating material 110 as compared to a rectangular shape for the interconnect member. A trapezoidal interconnect member 1902 is less likely to fall out of, or be pulled from (e.g., when removing perimeter ring portion 502) package 1800. In embodiments, interconnect members 506 may be trapezoidal, cylindrical (where a round surface is visible in FIG. 19), or other shape providing improved mechanical adhesion in a package.

Figure 20:
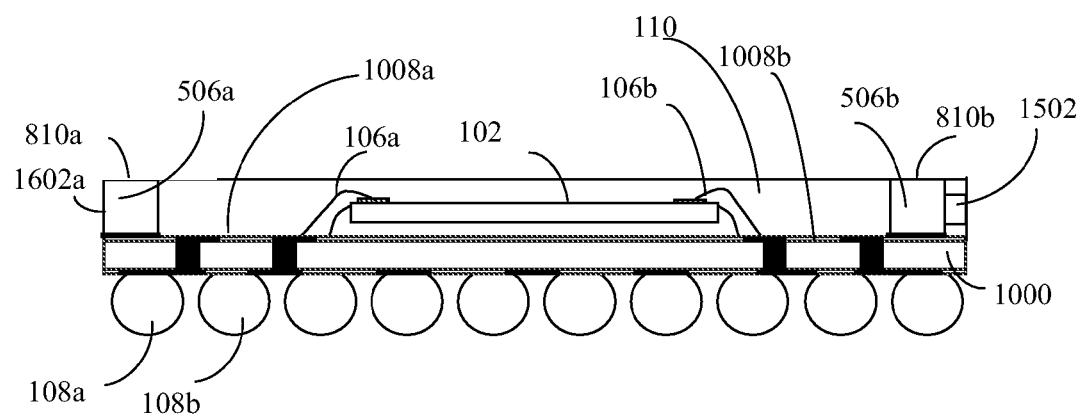
FIG. 20 shows a plurality of solder balls attached to a bottom surface of package, according to an example embodiment of the present invention.

In an embodiment, flowchart 900 may include additional assembly steps to form an integrated circuit package. For example, flowchart 900 may include attaching a plurality of solder balls to the substrate. For instance, FIG. 20 shows a plurality of solder balls 108 attached to a bottom surface of package 1500. Flowchart 900 may include steps of attaching die 102 to substrate 1000 (prior to or after step 902), attaching bond wires (in a wire bond orientation for die 102), and/or other assembly steps. In an embodiment, substrate 1000 may have a central cavity in which die 102 is mounted, to lower a profile of the resulting package.

Figure 21:
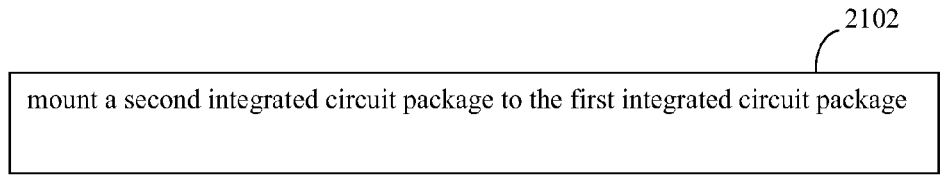
FIG. 21 shows a step that may be included in the flowchart of FIG. 9, according to an example embodiment of the present invention.
Figure 22:
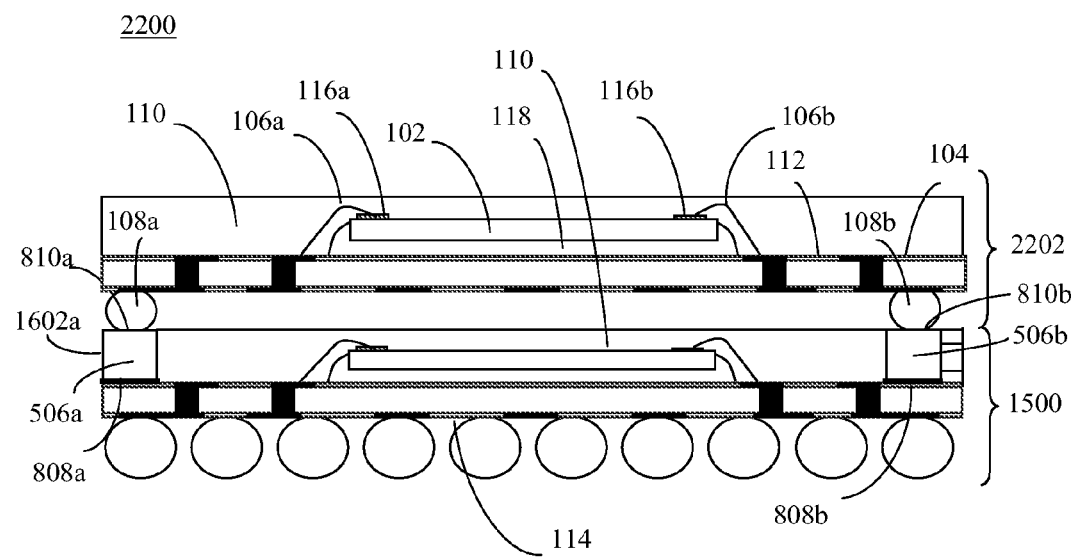
FIGS. 22 and 23 show package-on-package structures formed by stacking a second package on the package of FIG. 20, according to example embodiments of the present invention.

Furthermore, in an embodiment, flowchart 900 may include additional steps to form a package-on-package structure. For instance, FIG. 21 shows a step 2102 that may be included in flowchart 900. In step 2102, a second integrated circuit package is mounted to the first integrated circuit package. For example, FIG. 22 shows a package-on-package structure 2200 formed by stacking a second package 2202 on package 1500 of FIG. 20, according to an example embodiment of the present invention. In the example of FIG. 21, package 2202 is substantially similar to package 100 of FIG. 1. In alternative embodiments, other types of package 2202 may be stacked. As shown in FIG. 22, solder balls 108 on the bottom surface of package 2202 are attached to respective interconnect members 506 of package 1500.

For example, in an embodiment, package 2202 may be positioned on package 1500 so that solder balls 108 of package 2202 are aligned with corresponding ends 810 of interconnect members 506. For example, solder ball 108a may be aligned with end 810a of interconnect member 506a, and solder ball 108b may be aligned with end 810b of interconnect member 506b. Solder balls 108 of package 2202 may be reflowed to attach them to the corresponding interconnect members 506. Because interconnect members 506 are made of a solid material that does not reflow when solder balls 108 are reflowed, the material of interconnect members 506 will not partially or entirely flow from package 1500, even though side surfaces 1602 of interconnect members 506 (e.g., interconnect member 506a in FIG. 22) may not be covered by encapsulating material 110. Thus, POP structure 2200 does not suffer from the deficiencies of POP structure 400 described above.

Figure 23:
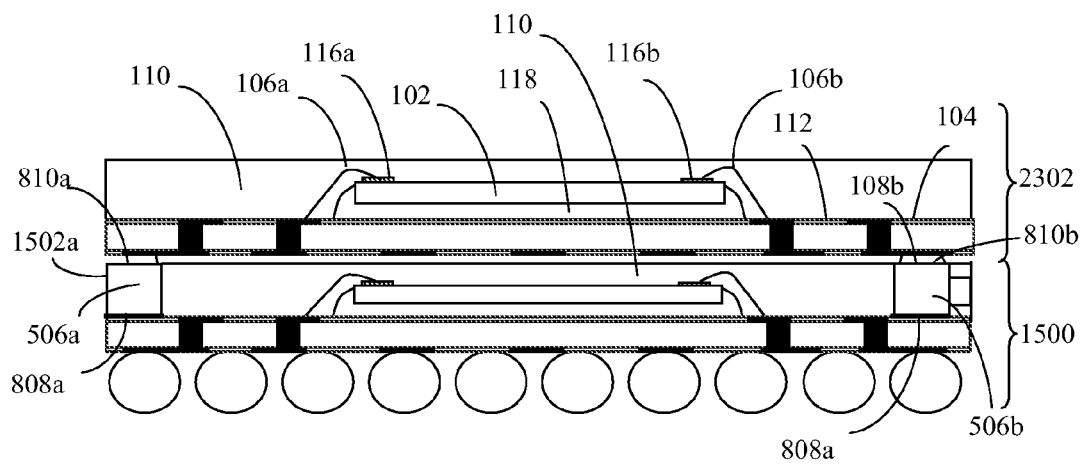

FIG. 23 shows a POP structure 2300 according to another example embodiment of the present invention. POP structure 2300 is similar to POP structure 2200 of FIG. 22, with package 2302 being a land grid array (LGA) type package. Package 2302 is coupled to package 1500 by soldering and/or otherwise attaching contact pads on a bottom surface of package 2302 to ends 810 of corresponding interconnect members 506 of package 1500.

Figure 24:
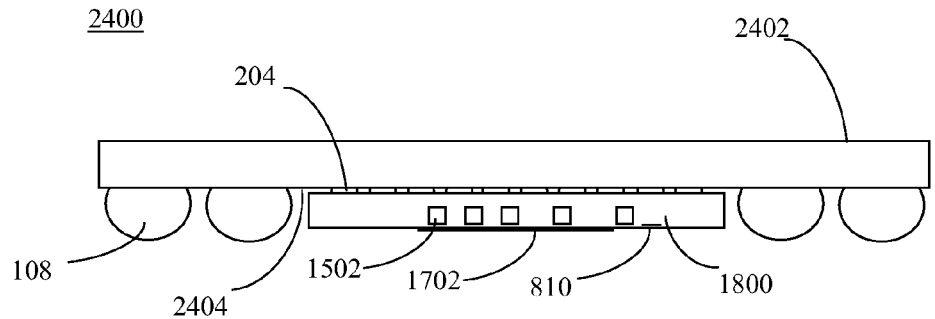
FIG. 24 shows a package-on-package structure, according to another embodiment of the present invention.

Package 1500 shown in FIG. 15 (or package 1800 shown in FIG. 18) may have second packages stacked on them, in embodiments of the present invention. Furthermore, packages 1500 and 1800 may be stacked on second packages in other configurations. For example, FIG. 24 shows a package-on-package structure 2400, according to another embodiment of the present invention. POP structure 2400 includes package 1800 of FIG. 18 mounted on an underside surface 2404 of a second package 2402, such that package 1800 is on the same surface of package 2402 as an array of solder balls 108 of second package 2402. In FIG. 24, package 1800 is flipped over with respect to the orientation of package 1800 in FIG. 18. Pads 204 of package 1800 are coupled to respective pads on surface 2404 of second package 2402. Side surfaces 1602 and ends 810 of interconnect members 506, and a surface of heat sink 1702 of package 1800 are exposed, and may be used for electrical connections, for heat spreading from structure 2400, and/or for other purposes. For instance, the configuration of FIG. 24 may be useful in applications requiring power/thermal management.

Further types of package stacking structures, in addition to those shown in FIGS. 22-24, will be apparent to persons skilled in the relevant art(s) from the teachings herein, and are also within the scope and spirit of the embodiments of the present invention.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A method of manufacturing an integrated circuit (IC) package structure, comprising:
   attaching an electrically conductive frame to a first surface of a substrate, the electrically conductive frame including a perimeter ring portion, a plurality of leads, and a plurality of interconnect members positioned within a periphery formed by the perimeter ring portion, wherein each interconnect member of the plurality of interconnect members is coupled to the perimeter ring portion by a respective lead of the plurality of leads, wherein each interconnect member has opposing first and second ends, wherein the first end of each interconnect member is coupled to the first surface of the substrate;
   applying an encapsulating material to the first surface of the substrate to at least partially encapsulate the electrically conductive frame such that the second end of each interconnect member is not covered by the encapsulating material; and
   removing a perimeter portion of the substrate to remove the perimeter ring portion from the electrically conductive frame and thereby isolate the plurality of interconnect members, and to uncover a side surface of at least one interconnect member from the encapsulating material.

2. The method of claim 1, further comprising:
   forming the electrically conductive frame such that a height of an interconnect member is greater than a height of the respective lead.

3. The method of claim 1, further comprising:
   attaching a plurality of solder balls to a second surface of the substrate.

4. The method of claim 3, further comprising:
   mounting a first integrated circuit package resulting from said attaching the plurality of solder balls to the substrate to a second integrated circuit package by coupling solder balls of the plurality of solder balls to respective contact pads on a surface of the second integrated circuit package.

5. The method of claim 1, further comprising:
mounting an integrated circuit die to the first surface of the substrate prior to said applying the encapsulating material to the first surface of the substrate.

6. The method of claim 1, further comprising:
mounting an integrated circuit die to the first surface of the substrate prior to said attaching the electrically conductive frame to the first surface of the substrate.

7. The method of claim 1, further comprising:
mounting a second integrated circuit package to a first integrated circuit package, the first integrated circuit package including the electrically conductive frame with the perimeter ring portion removed, the substrate, and the encapsulating material.

8. The method of claim 7, wherein said mounting comprises:
coupling each contact of a plurality of contacts on a surface of the second integrated circuit package to the second end of a corresponding interconnect member.

9. The method of claim 8, wherein said coupling comprises:
coupling each contact of the plurality of contacts through a solder ball to the second end of the corresponding interconnect member.

10. The method of claim 1, wherein the electrically conductive frame further includes a heat sink within the periphery formed by the perimeter ring portion, wherein the heat sink has opposing first and second surfaces, and is coupled to the perimeter ring portion by a respective lead of the plurality of leads, wherein said attaching comprises:
attaching the electrically conductive frame to the first surface of a substrate such that the first surface of the heat sink is coupled to a surface of an integrated circuit die attached to the first surface of the substrate;
wherein said applying comprises:
applying the encapsulating material to the first surface of the substrate to substantially encapsulate the electrically conductive frame such that the second surface of the heat sink is not covered by the encapsulating material; and
wherein said removing comprises:
removing the perimeter portion of the substrate to remove the perimeter ring portion from the electrically conductive frame and thereby isolate the heat sink.

* * * * *